(12) United States Patent
Brown (10) Patent No.: US 6,313,776 B1
(45) Date of Patent: Nov. 6, 2001

(54) CALIBRATED LINE DRIVER WITH DIGITAL-TO-ANALOG CONVERTER

(75) Inventor: Gary Brown, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/444,763

(22) Filed: Nov. 22, 1999

(51) Int. Cl.⁷ ............................. H03M 1/66; H04B 14/04
(52) U.S. Cl. .............................................. 341/144; 375/254
(58) Field of Search ..................................... 341/144, 118, 341/120; 375/254; 327/307, 175; 714/731

(56) References Cited

U.S. PATENT DOCUMENTS 3,824,694 * 7/1974 Lesperance et al. ............. 33/778
5,397,944 * 3/1995 DuPuis ............................. 327/307
6,160,851 * 12/2000 Brown et al. ..................... 375/254

* cited by examiner

Primary Examiner—Patrick Wamsley
(74) Attorney, Agent, or Firm—Pillsbury Winthrop LLP (57) ABSTRACT

In a line driver that utilizes a digital-to-analog converter (DAC) to generate a current that is used to form an output voltage $V_{OD}$, variations in the output voltage $V_{OD}$ are minimized by a calibration circuit that senses the output voltage $V_{OD}$, compares the output voltage $V_{OD}$ to a reference voltage, and then increments or decrements the bias current fed into the DAC to match the output voltage $V_{OD}$ to the reference voltage.

19 Claims, 6 Drawing Sheets

CALIBRATED LINE DRIVER WITH DIGITAL-TO-ANALOG CONVERTER

BACKGROUND OF THE INVENTION

1. Field of the Invention

The present invention relates to line drivers and, more particularly, to a calibrated line driver.

2. Description of the Related Art

A line driver is a device that drives a signal onto a transmission line, such as a local-area-network or telephone line. Line drivers are typically associated with transmit protocols that define the characteristics of the signal that is driven onto the line.

Figure 1:
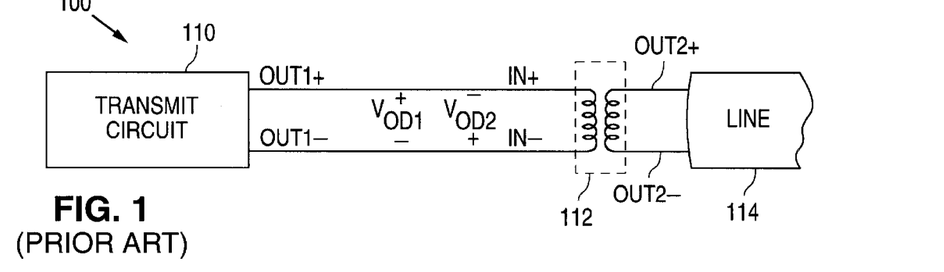
FIG. 1 is a schematic diagram illustrating a conventional line driver 100.

FIG. 1 shows a schematic diagram that illustrates a conventional line driver 100. As shown in FIG. 1, driver 100 includes a transmit circuit 110 which has a pair of differential outputs OUT1+ and OUT1−, and a transformer 112 which has a pair of inputs IN+ and IN− that are connected to the outputs OUT1+ and OUT1−. In addition, transformer 112 also has a pair of outputs OUT2+ and OUT2− that are connected to a transmission line 114, such as a CAT-5 coaxial cable.

Transmit circuit 110 can be implemented as a current-based circuit or as a voltage-based circuit. A current-based circuit can be implemented in a variety of ways, but typically includes a number of resistors, a number of current sources, and a number of switches.

Figure 2A:
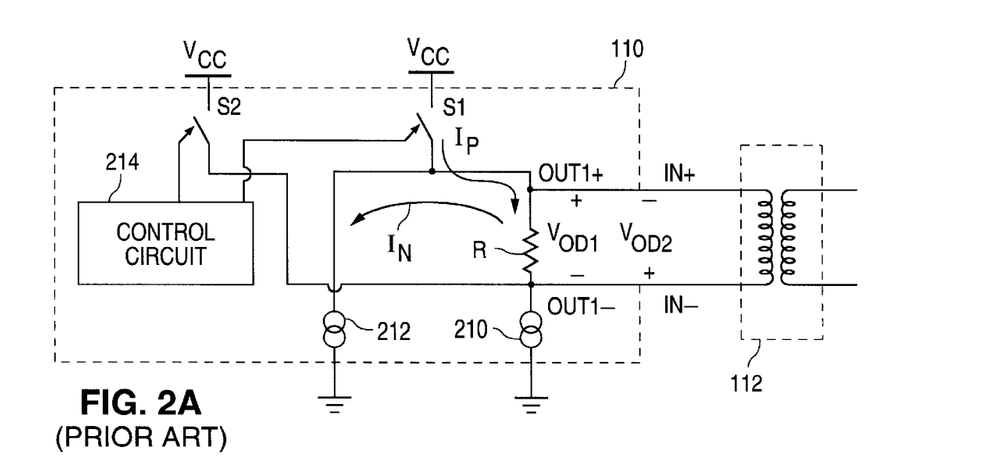
FIG. 2A is a schematic diagram illustrating a first example of a current-based transmit circuit 110.

FIG. 2A shows a schematic diagram that illustrates a first example of a current-based transmit circuit 110. As shown in FIG. 2A, circuit 110 includes a resistor R which is formed across the inputs IN+ and IN− of transformer 112, a first switch S1 which is connected between a power supply voltage Vcc and the input IN+, and a first current source 210 which is connected between the input IN− and ground.

In addition, circuit 110 also includes a second switch S2 which is connected between the power supply voltage Vcc and the input IN−, and a second current source 212 which is connected between the input IN+ and ground. Further, circuit 110 also includes a control circuit 214 that controls the operation of switches S1 and S2.

In operation, when switch S1 is closed and switch S2 is open, current source 210 pulls a current $I_P$, through resistor R which sets up a positive output voltage $V_{OD1}$ across the inputs IN+ and IN− of transformer 112. On the other hand, when switch S1 is open and switch S2 is closed, current source 212 pulls a current $I_N$ through resistor R which sets up a negative output voltage $V_{OD2}$ across the inputs IN+ and IN− of transformer 112. As shown, the negative output voltage $V_{OD2}$ has a polarity opposite to the polarity of voltage $V_{OD1}$.

In addition, when switches S1 and S2 are both open, a voltage intermediate to the output voltages $V_{OD1}$ and $V_{OD2}$ is placed across the inputs IN+ and IN− of transformer 112. (An intermediate voltage is required by some transmission protocols, such as MLT3.)

Figure 2B:
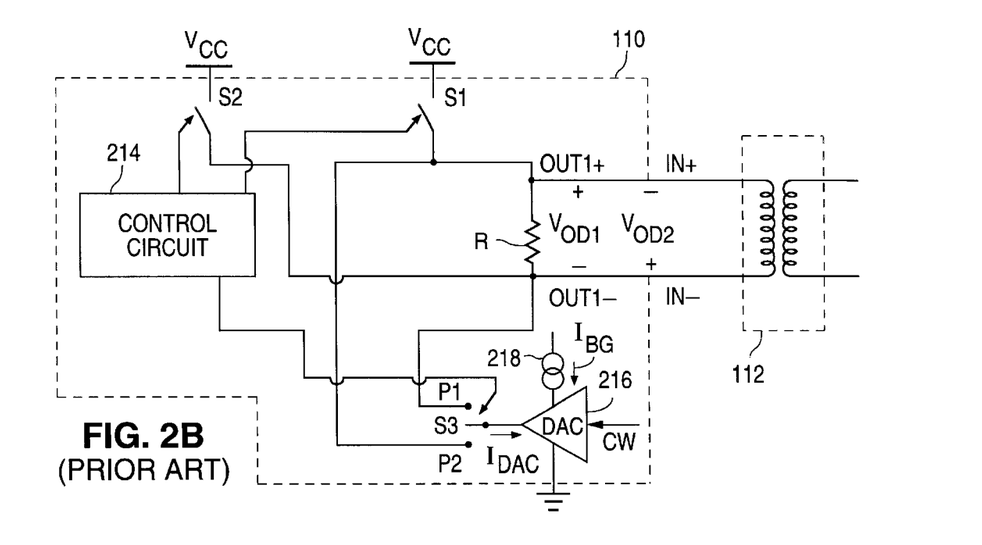
FIG. 2B is a schematic diagram illustrating a second example of a current-based transmit circuit 110.

FIG. 2B shows a schematic diagram that illustrates a second example of a current-based transmit circuit 110. Circuit 110 shown in FIG. 2B is similar to circuit 110 shown in FIG. 2A and, as a result, utilizes the same reference numbers to designate the structures which are common to both figures.

Circuit 110 of FIG. 2B differs from circuit 110 of FIG. 2A in that a third switch S3 and a multiplying digital-to-analog converter (DAC) 216 are used in lieu of current sources 210 and 212. Third switch S3, which is controlled by control circuit 214, has first and second positions P1 and P2. DAC 216, in turn, receives a bandgap current $I_{BG}$ from a bandgap current source 218, an n-bit control word CW, and sinks a DAC current $I_{DAC}$ which is defined by the bandgap current $I_{BG}$ and the control word CW.

Conventionally, switches S1, S2, and S3, DAC 216, and current source 218 are formed as part of a transmit integrated circuit, while resistor R is externally connected to the transmit integrated circuit. Control circuit 214, in turn, can be part of the transmit integrated circuit, or part of another integrated circuit that outputs control signals to the transmit integrated circuit.

In operation, when switch S1 is closed, switch S2 is open, and switch S3 is in position P1, DAC 216 pulls DAC current $I_{DAC}$ through resistor R which sets up the voltage $V_{OD1}$ across the inputs IN+ and IN− of transformer 112.

On the other hand, when switch S1 is open, switch S2 is closed, and switch S3 is in position P2, DAC 216 pulls DAC current $I_{DAC}$ through resistor R which sets up the voltage $V_{OD2}$ across the inputs IN+ and IN− of transformer 112.

As above, voltage $V_{OD2}$ has a polarity which is opposite to the polarity of voltage $V_{OD1}$. In addition, when switches S1 and S2 are both open, a voltage intermediate to the output voltages $V_{OD1}$ and $V_{OD2}$ is placed across the inputs IN+ and IN− of transformer 112.

Figure 3A:
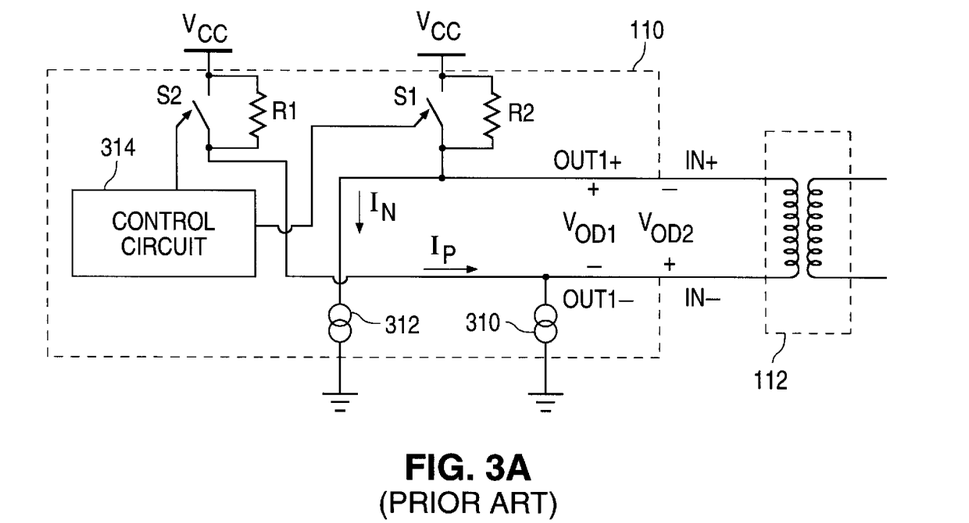
FIG. 3A is a schematic diagram illustrating a third example of a current-based transmit circuit 110.

FIG. 3A shows a schematic diagram that illustrates a third example of a current-based transmit circuit 110. As shown in FIG. 3A, circuit 110 includes a first resistor R1 which is connected between the input IN− and a power supply voltage Vcc, and a second resistor R2 which is connected between the input IN+ and the power supply voltage Vcc.

As further shown in FIG. 3A, circuit 110 includes a first switch S1 which is connected in parallel with resistor R2, and a second switch S2 which is connected in parallel with resistor R1. In addition, circuit 110 further includes a first current source 310 connected between the input IN− and ground, and a second current source 312 connected between the input IN+ and ground. Further, circuit 110 also includes a control circuit 314 that controls the operation of switches S1 and S2.

In operation, when switch S1 is closed and switch S2 is open, the power supply voltage Vcc is shorted to the input IN+, while current source 310 pulls a current $I_P$ through resistor R1 which sets up a voltage VP on the input IN− which is less than the power supply voltage Vcc−VP is a result, a voltage $V_{OD1}$ equal to Vcc−VP is dropped across the inputs IN+ and IN− of transformer 112.

On the other hand, when switch S1 is open and switch S2 is closed, the power supply voltage Vcc is shorted to the input IN−, while current source 312 pulls a current $I_N$ through resistor R2 which sets up a voltage VN on the input IN+ which is less than the power supply voltage Vcc.

As a result, a voltage $V_{OD2}$ equal to Vcc−VN is dropped across the inputs IN+ and IN− of transformer 112. In addition, when switches S1 and S2 are both open, a voltage intermediate to the output voltages $V_{OD1}$ and $V_{OD2}$ is placed across the inputs IN+ and IN− of transformer 112.

Figure 3B:
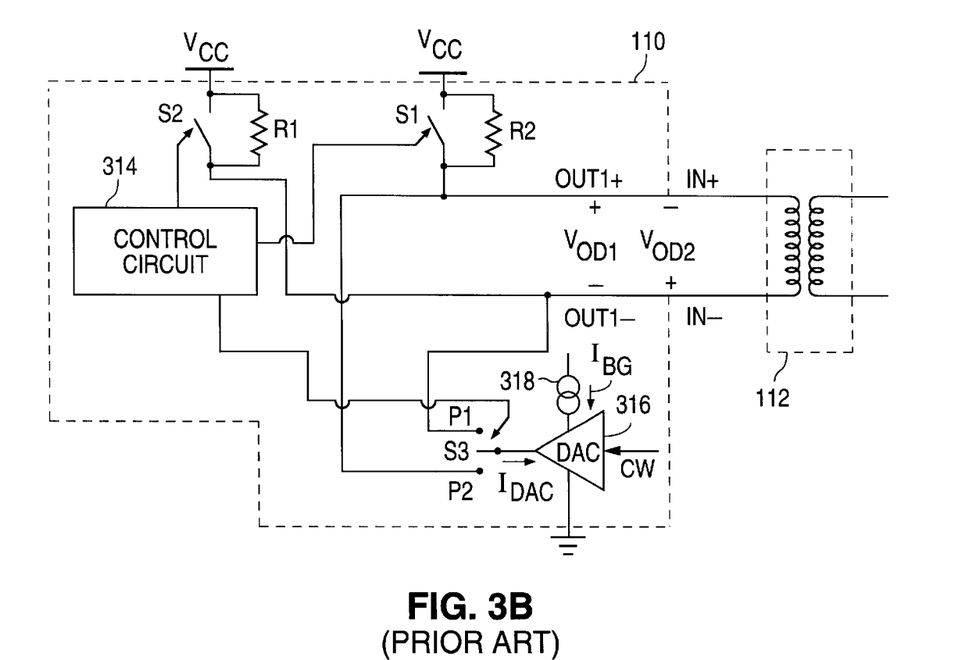
FIG. 3B is a schematic diagram illustrating a fourth example of a current-based transmit circuit 110.

FIG. 3B shows a schematic diagram that illustrates a fourth example of a current-based transmit circuit 110. Circuit 110 shown in FIG. 3B is similar to circuit 110 shown in FIG. 3A and, as a result, utilizes the same reference numbers to designate the structures which are common to both figures.

Circuit 110 of FIG. 3B differs from circuit 110 of FIG. 3A in that a third switch S3 which has first and second positions P1 and P2, and a multiplying DAC 316 are used in lieu of current sources 310 and 312. DAC 316 receives a bandgap current $I_{BG}$ from a bandgap current source 318, an n-bit control word CW, and sinks a current $I_{DAC}$ which is defined by the bandgap current $I_{BG}$ and the control word CW.

Conventionally, switches S1, S2, and S3, DAC 316, and current source 318 are formed as part of a transmit integrated circuit, while resistors R1 and R2 are externally connected to the transmit integrated circuit. Control circuit 314, in turn, can be part of the transmit integrated circuit, or part of another integrated circuit that outputs control signals to the transmit integrated circuit.

In operation, when switch S1 is closed, switch S2 is open, and switch S3 is in position P1, the power supply voltage Vcc is shorted to the input IN+, while DAC 316 pulls current $I_{DAC}$ through resistor R1. The current $I_{DAC}$ sets up a voltage VP on the input IN− which is less than the power supply voltage Vcc. As a result, the voltage $V_{OD1}$ (equal to Vcc−VP) is dropped across the inputs IN+ and IN− of transformer 112.

On the other hand, when switch S1 is open, switch S2 is closed, and switch S3 is in position P2, the power supply voltage Vcc is shorted to the input IN−, while DAC 316 pulls current $I_{DAC}$ through resistor R2. The current $I_{DAC}$ sets up the voltage VN on the input IN+ which is less than the power supply voltage Vcc.

As a result, the voltage $V_{OD2}$ (equal to Vcc−VN) is dropped across the inputs IN+ and IN− of transformer 112. In addition, when switches S1 and S2 are both open, a voltage intermediate to the output voltages $V_{OD1}$ and $V_{OD2}$ is placed across the inputs IN+ and IN− of transformer 112.

Figure 4A:
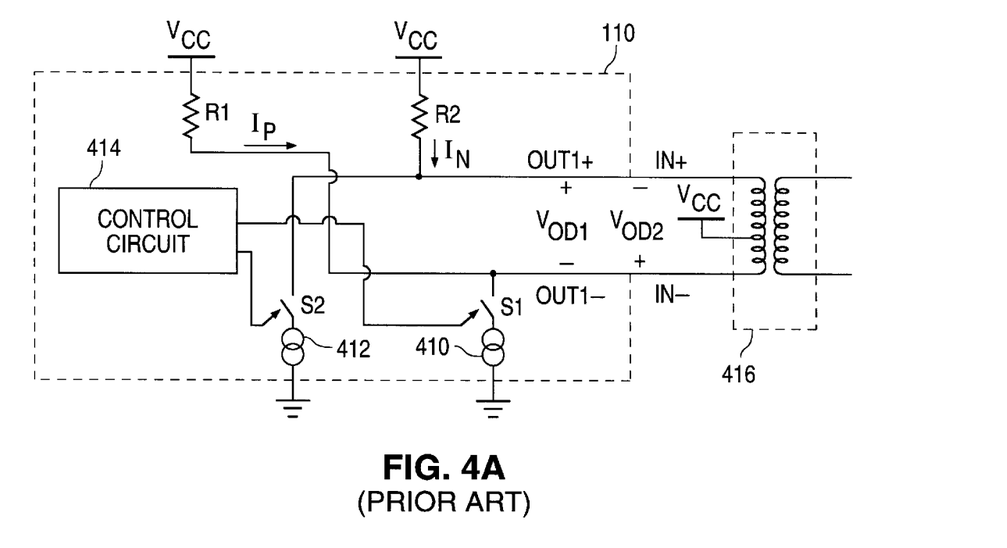
FIG. 4A is a schematic diagram illustrating a fifth example of a current-based transmit circuit 110.

FIG. 4A shows a schematic diagram that illustrates a fifth example of a current-based transmit circuit 110. As shown in FIG. 4A, circuit 110 includes a first resistor R1 which is connected between the input IN− and a power supply voltage Vcc, and a second resistor R2 which is connected between the input IN+ and the power supply voltage Vcc.

As further shown in FIG. 4A, circuit 110 includes a first switch S1 which is connected to resistor R1 and the input IN−, and a second switch S2 which is connected to resistor R2 and the input IN+. In addition, circuit 110 further includes a first current source 410 which is connected between switch S1 and ground, and a second current source 412 which is connected between the input IN+ and ground. Further, circuit 110 also includes a control circuit 414 that controls the operation of switches S1 and S2, and a transformer 416 which has a center tap connected to the power supply voltage Vcc.

In operation, when switch S1 is closed and switch S2 is open, the power supply voltage Vcc is present on the input IN+ as no current flows through resistor R2, while current source 410 pulls a current $I_P$ through resistor R1 which sets up a voltage VP on the input IN− which is less than the power supply voltage Vcc. As a result, a voltage $V_{OD1}$ equal to Vcc−VP is dropped across the center tap and the input IN− of transformer 112.

On the other hand, when switch S1 is open and switch S2 is closed, the power supply voltage Vcc is present on the input IN− as no current flows through resistor R1, while current source 412 pulls a current $I_N$ through resistor R2 which sets up a voltage VN on the input IN+ which is less than the power supply voltage Vcc. As a result, a voltage $V_{OD2}$ equal to Vcc−VN is dropped across the center tap and the input IN+ of transformer 112.

Figure 4B:
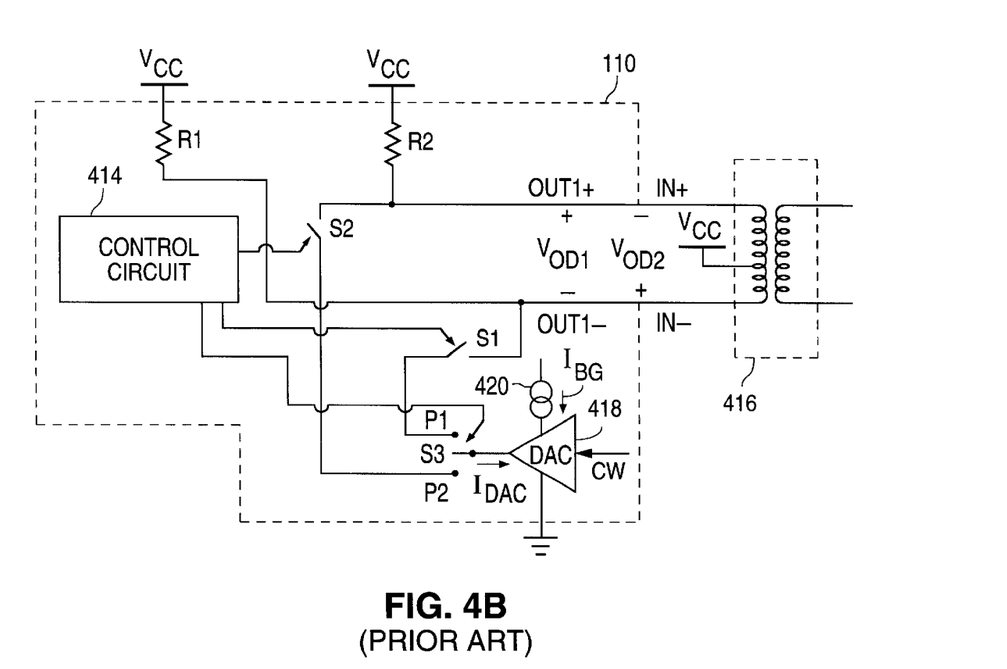
FIG. 4B is a schematic diagram illustrating a sixth example of a current-based transmit circuit 110.

FIG. 4B shows a schematic diagram that illustrates a sixth example of a current-based transmit circuit 110. Circuit 110 shown in FIG. 4B is similar to circuit 110 shown in FIG. 4A and, as a result, utilizes the same reference numbers to designate the structures which are common to both figures.

Circuit 110 of FIG. 4B differs from circuit 110 of FIG. 4A in that a third switch S3 which has first and second positions P1 and P2, and a multiplying DAC 418 are used in lieu of current sources 410 and 412. DAC 418 receives a bandgap current $I_{BG}$ from a bandgap current source 420, an n-bit control word CW, and sinks a current $I_{DAC}$ which is defined by the bandgap current $I_{BG}$ and the control word CW.

Conventionally, switches S1, S2, and S3, DAC 418, and current source 420 are formed as part of a transmit integrated circuit, while resistors R1 and R2 are externally connected to the transmit integrated circuit. Control circuit 414, in turn, can be part of the transmit integrated circuit, or part of another integrated circuit that outputs control signals to the transmit integrated circuit.

In operation, when switch S1 is closed, switch S2 is open, and switch S3 is in position P1, the power supply voltage Vcc is present on the input IN+ as no current flows through resistor R2, while DAC 418 pulls current $I_{DAC}$ through resistor R1. The current $I_{DAC}$ sets up the voltage VP on the input IN− which is less than the power supply voltage Vcc. As a result, the voltage $V_{OD1}$ (equal to Vcc−VP) is dropped across the inputs IN+ and IN− of transformer 112.

On the other hand, when switch S1 is open, switch S2 is closed, and switch S3 is in position P2, the power supply voltage Vcc is present on the input IN− as no current flows through resistor R1, while DAC 316 pulls current $I_{DAC}$ through resistor R2. The current $I_{DAC}$ sets up the voltage VN on the input IN+ which is less than the power supply voltage Vcc. As a result, the voltage $V_{OD2}$ (equal to Vcc−VN) is dropped across the inputs IN+ and IN− of transformer 112.

Figure 5:
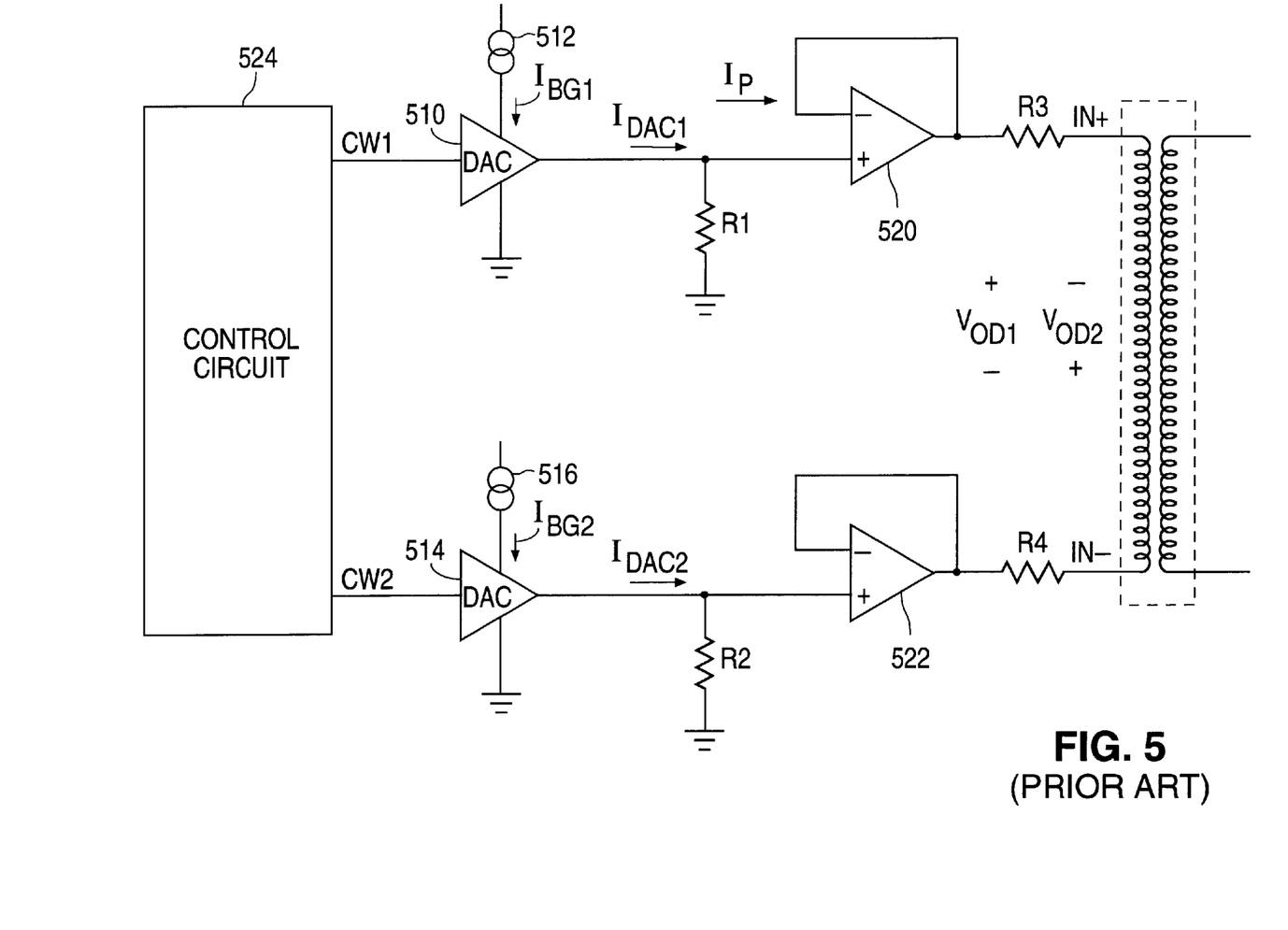
FIG. 5 is a schematic diagram illustrating an example of a voltage-based transmit circuit 110.

FIG. 5 shows a schematic diagram that illustrates an example of a voltage-based transmit circuit 110. As shown in FIG. 5, circuit 110 includes a first DAC 510, and a first bandgap-derived current source 512 that supplies a first biasing current $I_{BG1}$ to DAC 510. DAC 510 receives an n-bit control word CW1, and outputs a DAC current $I_{DAC1}$ in response to the biasing current $I_{BG1}$ and the control word CW1.

Circuit 110 also includes a second DAC 514, and a second bandgap-derived current source 516 that supplies a second biasing current $I_{BG2}$ to DAC 514. DAC 514 receives a m-bit control word CW2, and outputs a DAC current $I_{DAC2}$ in response to the biasing current $I_{BG2}$ and the control word CW2. (The n and m values may be equal.)

As further shown in FIG. 5, circuit 110 includes a first resistor R1 which is connected between the output of DAC 510 and ground, and a second resistor R2 which is connected between the output of DAC 514 and ground.

Circuit 110 further includes a first operational amplifier (op amp) 520 which has a non-inverting input connected to the output of DAC 510, and an inverting input connected to the output of op amp 520. Further, a third resistor R3 is connected between the output of op amp 520 and the input IN+ of transformer 112.

Circuit 110 additionally includes a second op amp 522 which has a non-inverting input connected to the output of DAC 514, and an inverting input connected to the output of op amp 522. A fourth resistor R4 is connected between the output of op amp 522 and the input IN− of transformer 112. Further, a control circuit 524 is connected to supply the control words CW1 and CW2.

Conventionally, DACs 510 and 514, current sources 512 and 516, and op amps 520 and 522 are formed as part of a transmit integrated circuit, while resistors R1, R2, R3, and R4 are externally connected to the transmit integrated circuit. Control circuit 524, in turn, can be part of the transmit integrated circuit, or part of another integrated circuit that outputs control signals to the transmit integrated circuit.

In operation, when the control words CW1 and CW2 cause DAC 510 to output a greater current than DAC 514, a positive output voltage $V_{OD1}$ is placed across the inputs IN+ and IN− of transformer 112. Similarly, when the control words CW1 and CW2 cause DAC 510 to output a lesser current than DAC 514, a negative output voltage $V_{OD2}$ is placed across the inputs IN+ and IN− of transformer 112.

When the control words CW1 and CW2 cause the DAC currents $I_{DAC1}$ and $I_{DAC2}$ to be equal, op amps 520 and 522 output equal but opposite voltages which, in turn, cause a voltage intermediate to the maximum output voltages $V_{OD1}$ and $V_{OD2}$ to be placed across the inputs IN+ and IN− of transformer 112.

Regardless of which transmit circuit is utilized, the transmit protocols for multiple-port transmit circuits typically require the ports to output matching differential output voltages $V_{OD}$ when presented with equivalent input conditions.

In actual practice, this is a difficult condition to meet. Initially, it is difficult to obtain matching output voltages $V_{OD}$ at a reference temperature, such as 50° C., because subtle variations in the internal routing within the transmit circuit can lead to unintended voltage drops which, in turn, lead to mismatched output voltages $V_{OD}$.

Once this hurdle is cleared, the differential voltage $V_{OD}$ output from each port typically varies at a different rate with variations in temperature. Further, variations in the manufacturing process can lead to variations in the output voltage $V_{OD}$.

These differences further increase the problem because it is difficult to make circuits that track process and temperature well. Thus, there is a need for a circuit that accounts for variations in the output voltages $V_{OD}$ to provide matched output voltages $V_{OD}$ in multiport drivers.

SUMMARY OF THE INVENTION

In a line driver that utilizes a digital-to-analog converter (DAC) to generate a current that is used to form an output voltage $V_{OD}$, the present invention minimizes variations in the output voltage $V_{OD}$ by increasing or decreasing the bias current fed into the DAC until the output voltage $V_{OD}$ is substantially equal to the voltage specified by the transmit protocols for the driver.

In accordance with the present invention, a line driving circuit includes a comparison circuit that senses a differential output voltage, compares the differential output voltage to a reference voltage, and outputs a compare signal that indicates whether the differential output voltage is greater than or less than the reference voltage.

In addition, the line driving circuit also includes a counter that sets an initial count value in response to a load signal, outputs the initial count value as a count, increments the count in response to a count up signal, and decrements the count in response to a count down signal.

The line driving circuit further includes a state machine that is connected to the counter and the comparison circuit. The state machine outputs the load signal, the count up signal, the count down signal, and control signals that control the comparison circuit.

The line driving circuit additionally includes a first digital-to-analog converter (DAC) that sources an output calibration current when the count is equal to a first predefined value, and increases the magnitude of the output calibration current when the count changes in a first direction. The DAC also sinks an input calibration current when the count is equal to a second predefined value, and decreases the magnitude of the input calibration current when the count changes in a second direction.

In addition, the present invention also includes a method for operating the circuit that includes the step of setting an initial count value in the counter in response to a load signal, and outputting the initial count value as a count to the DAC.

The method also includes the step of sensing an output differential voltage with the comparison circuit in response to the logic state of a calibration signal to form a first sensed output differential voltage, comparing the first sensed output differential voltage with a reference voltage, and outputting a comparison signal having a logic level that indicates whether the first sensed output differential voltage is greater than or less than the reference voltage.

The method further includes the step of changing the count in a first direction when the logic level of the comparison signal has a first level, and in a second direction when the logic level of the comparison signal has a second level.

The sensing step is repeated and, after each sensing step, the count is changed in the same direction unless the logic level of the comparison signal has changed.

A better understanding of the features and advantages of the present invention will be obtained by reference to the following detailed description and accompanying drawings which set forth an illustrative embodiment in which the principles of the invention are utilized.

DETAILED DESCRIPTION

Figure 6:
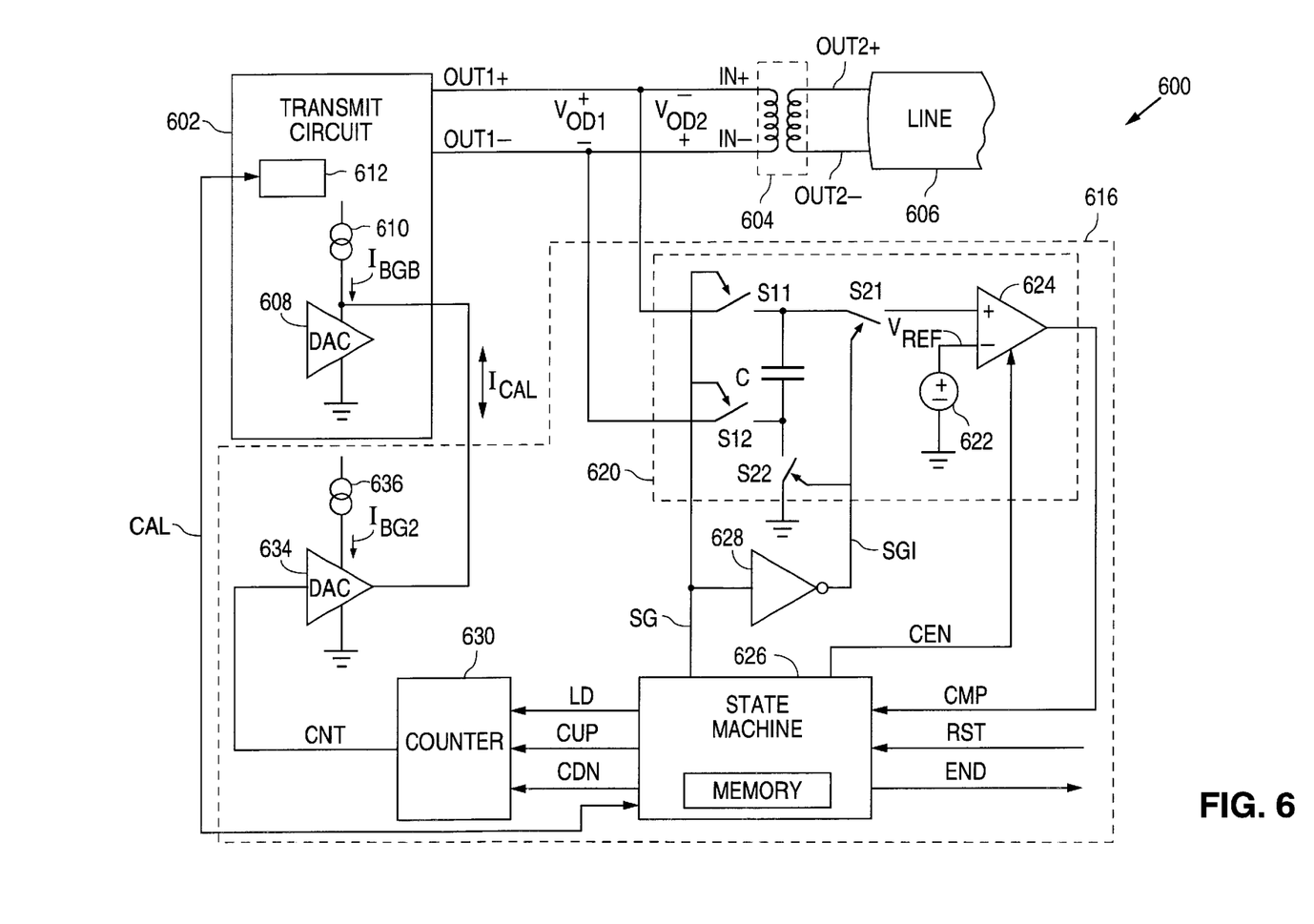
FIG. 6 is a schematic diagram illustrating a line driver 600 in accordance with the present invention.

FIG. 6 shows a schematic diagram that illustrates a line driver 600 in accordance with the present invention. As shown in FIG. 6, driver 600 includes a transmit circuit 602 which has a pair of differential outputs OUT1+ and OUT1−, and a transformer 604 which has a pair of inputs IN+ and IN− that are connected to the outputs OUT1+ and OUT1 − of circuit 602. In addition, transformer 604 also includes a pair of outputs OUT2+ and OUT2− that are connected to a transmission line 606.

Transmit circuit 602 includes a multiplying digital-to-analog converter (DAC) 608 and a bandgap-based current source 610 which sources a biasing current $I_{BGB}$ to DAC 608. In addition, circuit 602 also includes a control circuit 612 which controls the internal operation of circuit 602, such as the timing and control of the switches. Further, transformer 604 can be formed with a 1:1 or other ratios, and with or without a center tap.

In accordance with the present invention, driver 600 also includes a calibration circuit 616 that adjusts the magnitude of the biasing current $I_{BGB}$ received by DAC 608 which, in turn, allows the magnitude of a positive output voltage $V_{OD1}$ to be adjusted.

As further shown in FIG. 6, calibration circuit 616 includes a comparison circuit 620 that senses the output voltage $V_{OD1}$ across the outputs OUT1+ and OUT1− of transmit circuit 602, and compares the output voltage $V_{OD1}$ to a positive reference voltage $V_{REF}$.

In addition, comparison circuit 620 outputs a compare signal CMP that indicates whether the output voltage $V_{OD1}$ is greater than or less than the reference voltage $V_{REF}$. The reference voltage $V_{REF}$, in turn, is equal to the magnitude of the output voltage $V_{OD1}$ as specified by the transmit protocols of driver 600.

Comparison circuit 620 can be implemented by utilizing a first pair of switches S11 and S12 which have inputs connected to outputs OUT1+ and OUT1−, respectively, a capacitor C which is connected across the outputs of switches S11 and S12, and a second pair of switches S21 and S22. Switch S21 has an input connected to the output of switch S11, while switch S22 is connected between the output of switch S12 and ground.

In addition, comparison circuit 620 in this implementation also includes a bandgap-derived voltage source 622 that outputs the reference voltage $V_{REF}$, and a comparator 624 which has a non-inverting input connected to the output of switch S21, and an inverting input connected to voltage source 622. Voltage source 622 can be fixed if driver 600 is to support only a single transmit protocol, or programmable if driver 600 is to support multiple transmit protocols, e.g., both 10 BASE-T and 100 BASE-T.

As further shown in FIG. 6, calibration circuit 616 also includes a state machine 626 that is connected to comparison circuit 620, and an inverter 628 that is connected to state machine 626 and switches S21 and S22. State machine 626, which includes a one-bit memory, receives the comparison signal CMP and a number of control signals that include a reset signal RST, and a calibration signal CAL.

In addition, state machine 626 outputs a switching signal SG to switches S11 and S12, and to inverter 628 which, in turn, outputs an inverted switching signal SGI. State machine 626 also outputs a comparator enable signal CEN, a load signal LD, a count up signal CUP, a count down signal CDN, and an end signal END.

Calibration circuit 616 further includes an n-bit counter 630 which is connected to state machine 626 to receive the load signal LD, the count up signal CUP, and the count down signal CDN. In addition, counter 630 also outputs a count CNT which reflects the value held by counter 630.

Further, calibration circuit 616 includes a multiplying DAC 634 and a bandgap-based current source 636 which sources a biasing $I_{BG2}$ to DAC 634. DAC 634 receives the count CNT, and either sources a calibration current $I_{CAL}$, sinks the calibration current $I_{CAL}$, or neither sources or sinks the calibration current $I_{CAL}$ to a node between DAC 608 and current source 610 in response to the count CNT.

In operation, state machine 626 begins in a start state, and moves to a reset state in response to the reset signal RST which can result from a power-up condition or a reset command. In the reset state, state machine 626 outputs the load signal LD to counter 630.

The load signal LD causes counter 630 to load and output a predefined value, such as 1111-0000, as the count CNT. DAC 634 responds to the count CNT by entering an initial state where no current is sourced to transmit circuit 602, or sunk from circuit 610. Following this, state machine 626 moves into an idle state.

State machine 626 remains in the idle state until a calibration signal CAL is received. Once the calibration signal CAL is received, state machine 626 moves into a sample state where state machine 626 sets the logic level of the switching signal SG to a first logic level.

In addition, the calibration signal CAL also causes control circuit 612 of transmit circuit 602 to output the positive output voltage $V_{OD1}$ which may be continuously present or part of a test pattern. When part of a test pattern, the timing of state machine 626 must be set so that the to-be-described sampling takes place when the positive output voltage $V_{OD1}$ is present.

The first logic level of switching signal SG causes switches S11 and S12 to close, while the inverted switching signal SGI output from inverter 628 causes switches S21 and S22 to open. When switches S11 and S12 are closed, and switches S21 and S22 are open, the voltage on capacitor C is charged up to the positive output voltage $V_{OD1}$ output by transmit circuit 602.

After this, state machine 626 moves into a processing state where state machine 626 sets the logic level of the switching signal SG to a second logic level, and the logic level of the comparator enable signal CEN to a first logic level. (The enable signal CEN is not required, but allows power to be conserved when no comparison is being performed.)

The second logic level of switching signal SG causes switches S11 and S12 to open, while the inverted switching signal SGI causes switches S21 and S22 to close. As a result, the positive output voltage $V_{OD1}$, which is now referenced to ground, appears on the non-inverting input of comparator 624.

The first logic level of the enable signal CEN enables comparator 624 which, in turn, compares the positive output voltage $V_{OD1}$ on the non-inverting input with the reference voltage $V_{REF}$ on the inverting input, and sets the logic level of the compare signal CMP to indicate whether the output voltage $V_{OD1}$ is greater than or less than the reference voltage $V_{REF}$. State machine 626 then detects and stores the logic level of the compare signal CMP. When the compare signal CMP has the first logic level, state machine 626 determines this condition to mean that the positive output voltage $V_{OD1}$ is less than the reference voltage $V_{REF}$, and outputs a count up signal CUP.

The count up signal CUP causes counter 630 to increment the count CNT, such as to 1111-0001 (i.e., to change the count CNT in a positive direction). DAC 634 responds to the increased count by sourcing the calibration current $I_{CAL}$ to the node between DAC 608 and current source 610 of transmit circuit 602. The calibration current $I_{CAL}$ causes DAC 608 to sink a larger current which, in turn, increases the magnitude of the positive output voltage $V_{OD1}$.

At this point, state machine 626 can be implemented to return to the idle state and wait for the next calibration signal, or can return to the sample state to continue until the calibration operation is complete.

When state machine 626 next returns to the sample state, state machine 626 again controls the logic levels of the switching signal SG and the enable signal CEN so that the increased positive output voltage $V_{OD1}$ is presented to comparator 624.

Comparator 624 compares the increased positive output voltage $V_{OD1}$ with the reference voltage $V_{REF}$, and sets the logic level of the compare signal CMP to indicate whether the output voltage $V_{OD1}$ is greater than or less than the reference voltage $V_{REF}$.

State machine 626 then detects the logic level of the compare signal CMP and, unlike the first pass through, compares the logic level of the current compare signal CMP to the logic level of the previous compare signal CMP which was stored by state machine 626.

If the logic level of the compare signal CMP is the same as the previous logic level, state machine 626 determines this condition to mean that the positive output voltage $V_{OD1}$ is still less than the reference voltage $V_{REF}$, and again outputs a count up signal CUP.

The count up signal CUP causes counter 630 to increment the count CNT, such as to 1111-0010. DAC 634 responds to the increased count by increasing the calibration current $I_{CAL}$ sourced to the node between DAC 608 and current source 610 of transmit circuit 602. The increased current causes DAC 608 to sink a larger current which, in turn, again increases the magnitude of the positive output voltage $V_{OD1}$.

State machine continues to loop through the sample and processing states, incrementing the count with each loop, until state machine 626 detects that the logic level of the current compare signal CMP is different from the logic level of the previous compare signal CMP.

When state machine 626 detects that the logic level of the compare signal CMP is different from the logic level of the previous compare signal CMP, state machine 626 determines this condition to mean that the positive output voltage $V_{OD1}$ is now greater than the reference voltage $V_{REF}$.

In this case, state machine 626 stores the logic level of the current compare signal CMP, and then moves into an end state where state machine 626 outputs an end signal END that indicates that the calibration operation has been completed. Following this, state machine 626 again returns to the idle state.

The accuracy with which the output voltage $V_{OD1}$ is calibrated is determined by the maximum change in current and the number of bits of counter 630. Thus, by using a larger number of bits, smaller amounts of current are added each time the count is incremented by one, thereby producing a greater accuracy.

The present invention works equally well in the opposite direction. If, on the first pass through, the compare signal CMP is in the second logic level, state machine 626 determines this condition to mean that the positive output voltage $V_{OD1}$ is greater than the reference voltage $V_{REF}$, and outputs a count down signal CDN.

The count down signal CDN causes counter 630 to decrement the count CNT, such as to 1110-1111 (i.e., to change the count CNT in a negative direction). DAC 634 responds to the decreased count by sinking the calibration current $I_{CAL}$ from the node between DAC 608 and current source 610 of transmit circuit 602. The reduced current flowing into DAC 608 causes DAC 608 to sink a smaller current which, in turn, decreases the magnitude of the positive output voltage $V_{OD1}$.

When state machine 626 next returns to the sample state, state machine 626 again controls the logic levels of the switching signal SG and the enable signal CEN so that the decreased positive output voltage $V_{OD1}$ is presented to comparator 624.

Comparator 624 again compares the positive output voltage $V_{OD1}$ with the reference voltage $V_{REF}$, and sets the logic level of the compare signal CMP to indicate whether the output voltage $V_{OD1}$ is greater than or less than the reference voltage $V_{REF}$.

State machine 626 then detects the logic level of the compare signal CMP and, unlike the first pass through, compares the logic level of the current compare signal CMP to the logic level of the previous compare signal CMP which was stored by state machine 626.

If the logic level of the compare signal CMP is the same as the previous logic level, state machine 626 determines this condition to mean that the positive output voltage $V_{OD1}$ is still greater than the reference voltage $V_{REF}$, and again outputs a count down signal CDN.

The count down signal CDN causes counter 630 to decrement the count CNT, such as to 1110-1110. DAC 634 responds to the decreased count by increasing the calibration current $I_{CAL}$ sunk from the node between DAC 608 and current source 610 of transmit circuit 602. The decreased current flowing into DAC 608 causes DAC 608 to sink a smaller current which, in turn, decreases the magnitude of the positive output voltage $V_{OD1}$.

State machine 626 continues to loop through the sample and processing states, decrementing the count with each loop, until state machine 626 detects that the logic level of the current compare signal CMP is different from the logic level of the previous compare signal CMP.

When state machine 626 detects that the logic level of the compare signal CMP is different from the logic level of the previous compare signal CMP, state machine 626 determines this condition to mean that the positive output voltage $V_{OD1}$ is now less than the reference voltage $V_{REF}$.

In this case, state machine 626 stores the logic level of the current compare signal CMP, and then moves into the end state where state machine 626 outputs the end signal END. Following this, state machine 626 again returns to the idle state. At this point, the calibration is complete.

Although the present invention has been described in terms of comparing the positive output voltage $V_{OD1}$ with a positive reference voltage $V_{REF}$, the present invention is equally applicable to a circuit that compares a negative output voltage $V_{OD2}$ with a negative reference voltage.

Driver 600 of the present invention may be implemented with any operational combination of a transmit circuit and a transformer where the transmit circuit includes a DAC, and a current source that biases the DAC. (A control circuit may or may not be included in the transmit circuit as discussed above.)

Thus, for example, the calibration current $I_{CAL}$ can be sourced to, or sunk from, the node between DAC 216 and the current source 218 of FIG. 2B; the node between DAC 316 and the current source 318 of FIG. 3B; the node between DAC 416 and the current source 418 of FIG. 4B; or the node between DAC 510 and the current source 512, and the node between DAC 514 and the current source 516 of FIG. 5.

In transmit circuits where a single resistor sets up the voltage across the inputs IN+ and IN−, such as circuit 110 in FIG. 2B, calibration circuit 616 minimizes variations in the both the positive and negative output voltages $V_{OD1}$ and $V_{OD2}$ since only one resistor is used. The variations that are minimized are due to variations in the values of the resistor and the transformer along with variations due to routing, temperature, and process, and are minimized to within the precision of the least significant bit of counter 630.

In transmit circuits where two resistors set up the positive and negative output voltages $V_{OD1}$ and $V_{OD2}$ across the inputs IN+ and IN−, such as circuits 110 in FIGS. 3B and 4B, and 5, calibration circuit 616 precisely minimizes variations in only one of the output voltages $V_{OD1}$ or $V_{OD2}$ as only one resistor is used during the calibration.

Thus, for example, if the calibration is performed by pulling a current through resistor R1 and comparing the voltage to a positive reference voltage, greater variations may be present when a current is pulled through resistor R2 to the extent that resistor R2 does not match resistor R1.

In most instances, the difference between the values of resistors R1 and R2, which are nominally the same, will not be enough to cause the negative output voltage $V_{OD2}$ to fall outside of the transmit specification when the positive output voltage $V_{OD1}$ is centered within the transmit specification.

However, if greater accuracy is desired, a calibration can be run for both the positive and negative output voltages $V_{OD1}$ and $V_{OD2}$. Following this, an algorithm can be run to find the calibration current $I_{CAL}$ that optimizes both the positive and negative output voltages $V_{OD1}$ and $V_{OD2}$.

Figure 7:
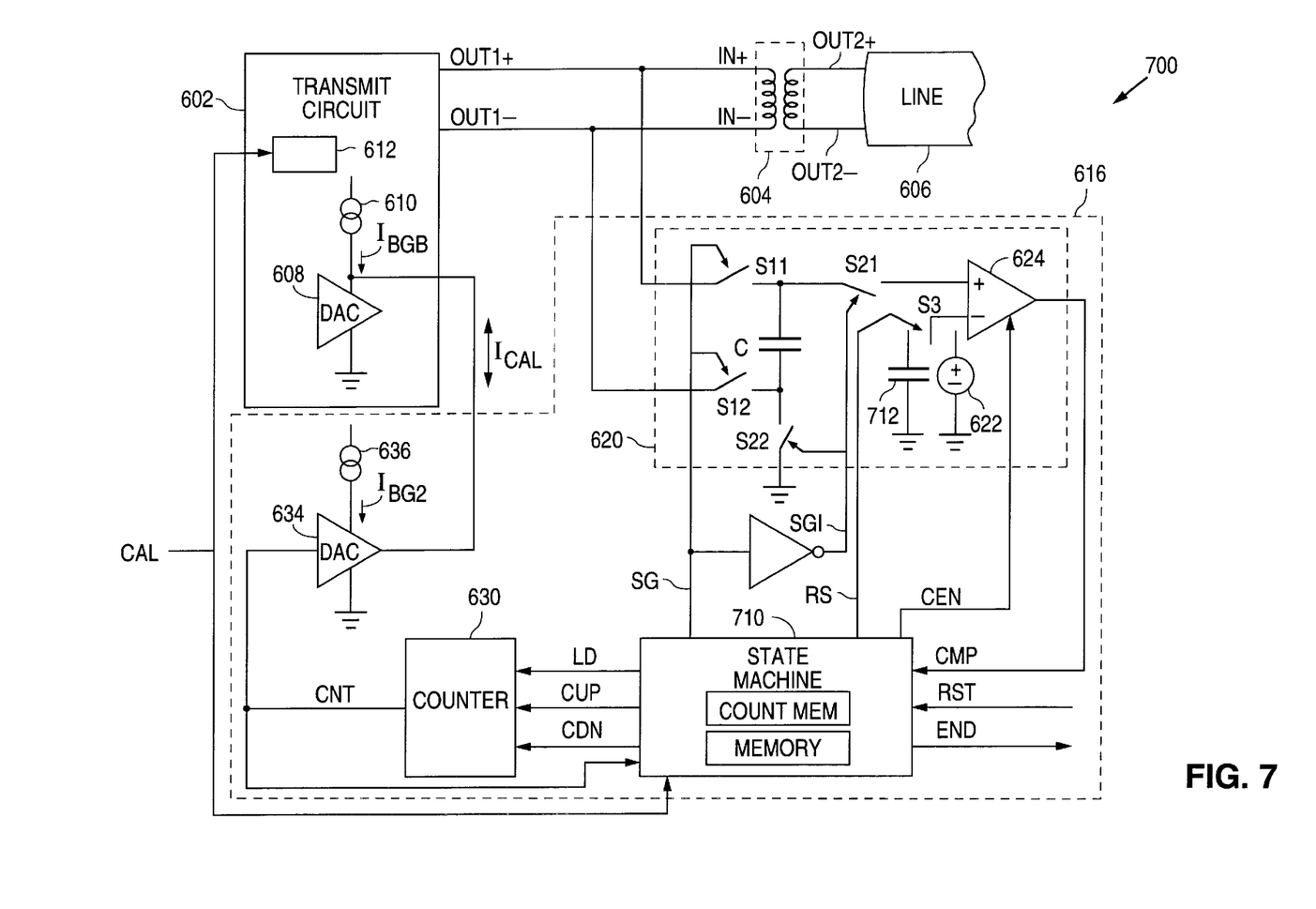
FIG. 7 is a schematic diagram illustrating a line driver 700 in accordance with an alternate embodiment the present invention.

FIG. 7 shows a schematic diagram that illustrates a line driver 700 in accordance with an alternate embodiment the present invention. Driver 700 is similar to driver 600 and, as a result, utilizes the same reference numerals to designate the structures which are common to both drivers. As shown in FIG. 7, driver 700 differs from driver 600 in that driver 700 includes a state machine 710 that includes a count memory, a negative voltage reference 712, and a switch S3.

State machine 710 initially operates the same as state machine 626 except that state machine 710 also outputs a reference switch signal RS to select the positive reference voltage 622.

State machine 710 divergers from state machine 626 in that, rather than outputting the end signal END as described above, state machine 710 latches the value of the count CNT, again outputs the load signal LD, and changes the logic state of the reference switch signal RS to select the negative reference voltage 712.

The process continues as described above except that comparison circuit 620 now compares the negative output voltage $V_{OD2}$ to the negative reference voltage (an appropriate test signal must be output by control circuit 612). When the calibration of the negative voltage is complete, state machine 710 again latches the value of the CNT and outputs the load signal LD.

Based on the two counts, state machine 710 determines a count that optimizes both the positive and negative output voltages $V_{OD1}$ and $V_{OD2}$ with respect to the transmit specification, and then issues the necessary count up or count down pulses to set the count in counter 630. Following this, state machine 710 outputs the end signal END and enters the idle state.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A line driving circuit comprising:

a comparison circuit that senses a differential output voltage, compares the differential output voltage to a reference voltage, and outputs a compare signal that indicates whether the differential output voltage is greater than or less than the reference voltage, the comparison circuit having:
  a first switch having an input and an output;
  a second switch having an input and an output, the inputs of the first and second switches being connected to sense the differential output voltage;
  a capacitor connected across the outputs of the first and second switches;
  a third switch having an input connected to the output of the first switch, and an output;
  a fourth switch having an input connected to the output of the second switch, and an output connected to ground;
  a voltage source; and
  a comparator having a non-inverting input connected to the output of third switch, and an inverting input connected to the voltage source;

a counter that sets an initial count value in response to a load signal, outputs the initial count value as a count, increments the count in response to a count up signal, and decrements the count in response to a count down signal;

a state machine connected to the counter and the comparison circuit, the state machine outputting the load signal, the count up signal, the count down signal, and control signals that control the comparison circuit; and a first digital-to-analog converter (DAC) that sources an output calibration current having a magnitude when the count is equal to a first predefined value, and increases the magnitude of the output calibration current when the count changes in a first direction, and that sinks an input calibration current having a magnitude when the count is equal to a second predefined value, and decreases the magnitude of the input calibration current when the count changes in a second direction.

2. The circuit of claim 1 and further comprising:

a current source that outputs a first current, the first current having a magnitude; and a second DAC that receives the first current and a control word, and controls a second current in response to the magnitude of the first current and the control word, the magnitude of the first current received by the second DAC being increased when the first DAC sources the output calibration current, and being decreased when the first DAC sinks the input calibration current.

3. The circuit of claim 2 and further comprising a node connected between the current source and the second DAC, the node being connected to the first DAC.

4. The circuit of claim 2 wherein the first direction is an increasing count.

5. The circuit of claim 2 wherein the second direction is a decreasing count.

6. The circuit of claim 1 wherein the voltage source outputs a single voltage.

7. The circuit of claim 1 wherein the voltage source selectively outputs one of a plurality of voltages.

8. A line driving circuit comprising:

a comparison circuit that senses a differential output voltage, compares the differential output voltage to a reference voltage, and outputs a compare signal that indicates whether the differential output voltage is greater than or less than the reference voltage;

a counter that sets an initial count value in response to a load signal, outputs the initial count value as a count, increments the count in response to a count up signal, and decrements the count in response to a count down signal;

a state machine connected to the counter and the comparison circuit, the state machine outputting the load signal, the count up signal, the count down signal, and control signals that control the comparison circuit;

an inverter connected between the state machine and the comparison circuit; and a first digital-to-analog converter (DAC) that sources an output calibration current having a magnitude when the count is equal to a first predefined value, and increases the magnitude of the output calibration current when the count changes in a first direction, and that sinks an input calibration current having a magnitude when the count is equal to a second predefined value, and decreases the magnitude of the input calibration current when the count changes in a second direction.

9. The line driving circuit of claim 8 wherein the comparison circuit includes:

a voltage source, the voltage source selectively outputting one of a plurality of voltages in response to a control signal output by the state machine; and a comparator having a non-inverting input connected to the output of third switch, and an inverting input connected to the voltage source.

10. The line driving circuit of claim 8 wherein the state machine includes:

a first memory for storing a logic level of the compare signal, and a second memory for storing a plurality of counts.

11. The circuit of claim 8 and further comprising:

a current source that outputs a first current, the first current having a magnitude; and a second DAC that receives the first current and a control word, and controls a second current in response to the magnitude of the first current and the control word, the magnitude of the first current received by the second DAC being increased when the first DAC sources the output calibration current, and being decreased when the first DAC sinks the input calibration current.

12. A line driving circuit comprising:

a comparison circuit that senses a differential output voltage, compares the differential output voltage to a reference voltage, and outputs a compare signal that indicates whether the differential output voltage is greater than or less than the reference voltage;

a counter that sets an initial count value in response to a load signal, outputs the initial count value as a count, increments the count in response to a count up signal, and decrements the count in response to a count down signal;

a state machine connected to the counter and the comparison circuit, the state machine outputting the load signal, the count up signal, the count down signal, and control signals that control the comparison circuit, the state machine having:

a first memory for storing a logic level of the compare signal, and a second memory for storing the count;

a first digital-to-analog converter (DAC) that sources an output calibration current having a magnitude when the count is equal to a first predefined value, and increases the magnitude of the output calibration current when the count changes in a first direction, and that sinks an input calibration current having a magnitude when the count is equal to a second predefined value, and decreases the magnitude of the input calibration current when the count changes in a second direction.

13. The line driving circuit of claim 12 wherein the comparison circuit includes:

a voltage source, the voltage source selectively outputting one of a plurality of voltages in response to a control signal output by the state machine; and a comparator having a non-inverting input connected to the output of third switch, and an inverting input connected to the voltage source.

14. The line driving circuit of claim 12 wherein the state machine includes an inverter connected to the state machine and the comparison circuit.

15. The circuit of claim 12 and further comprising:

a current source that outputs a first current, the first current having a magnitude; and a second DAC that receives the first current and a control word, and controls a second current in response to the magnitude of the first current and the control word, the magnitude of the first current received by the second DAC being increased when the first DAC sources the output calibration current, and being decreased when the first DAC sinks the input calibration current.

16. A method for operating a compensation circuit, the compensation circuit having:

a comparison circuit;

a counter;

a state machine connected to the counter and the comparison circuit; and a digital-to-analog converter (DAC) that sources an output calibration current having a magnitude when the count is equal to a first predefined value, and increases the magnitude of the output calibration current when the count changes in a first direction, and that sinks an input calibration current having a magnitude when the count is equal to a second predefined value, and decreased the magnitude of the input calibration current when the count changes in a second direction, the method comprising the steps of:

setting an initial count value in the counter in response to a load signal, and outputting the initial count value as a count to the DAC;

sending an output differential voltage with the comparison circuit in response to the logic state of a calibration signal to form a first sensed output differential voltage, comparing the first sensed output differential voltage with reference voltage, and outputting a comparison signal having a logic level that indicates whether the first sensed output differential voltage is greater than or less than the reference voltage;

changing the count in a first direction when the logic level of the comparison signal has a first level, and in a second direction when the logic level of the comparison signal has a second level;

repeating the sensing step and, after each sensing step, changing the cunt in a same direction unless the logic level of the comparison signal has changed;

storing the count as first count when the logic level of the comparison signal has changed;

setting the initial count value in the counter to output the count to the DAC after the first count has been stored;

detecting the output differential voltage with the comparison circuit to form a second sensed output differential voltage, comparing the sensed output differential voltage with a reference voltage, and outputting comparison signal, the second sensed output voltage having a polarity opposite to the first sensed output voltage;

changing the count in a first direction when the logic level of the comparison signal has a first level, and in a second direction when the logic level of the comparison signal has a second level;

repeating the detecting step and, after each detecting step, changing the count in a same direction unless the logic level of the comparison signal has changed;

storing the count when the logic level of the comparison signal has changed; and determining a final count in response to the first and second counts.

17. The method of claim 16 and further comprising the steps of:

storing the logic level of the comparison signal; and comparing a current logic level of the comparison signal with a past logic level of the comparison signal to determine if the logic level has changed.

18. The method of claim 16 wherein the reference voltage is a positive voltage.

19. The method of claim 16 wherein the reference voltage is a negative voltage.

* * * * *

UNITED STATES PATENT AND TRADEMARK OFFICE
CERTIFICATE OF CORRECTION

PATENT NO. : 6,313,776 B1  
DATED : November 6, 2001  
INVENTOR(S) : Gary Brown

It is certified that error appears in the above-identified patent and that said Letters Patent is hereby corrected as shown below:

Column 14,  
Line 41, delete "decreased" and replace with -- decreases --.  
Line 47, delete "sending" and replace with -- sensing --.  
Line 51, after "with" insert -- a --.  
Line 61, delete "cunt" and replace with -- count --.  
Line 63, after "as" insert -- a --.

Signed and Sealed this

Twelfth Day of March, 2002

*Attest:*

JAMES E. ROGAN  
*Director of the United States Patent and Trademark Office*

*Attesting Officer*